United States Patent [19]

Stein

[11] 4,245,167
[45] Jan. 13, 1981

[54] PULSE GENERATOR FOR PRODUCING FIXED WIDTH PULSES

[75] Inventor: Marc T. Stein, Tempe, Ariz.

[73] Assignee: Motorola Inc., Schaumburg, Ill.

[21] Appl. No.: 967,769

[22] Filed: Dec. 8, 1978

[51] Int. Cl.³ .............. H03K 3/017; H03K 3/284; H03K 5/153
[52] U.S. Cl. .................. 307/265; 307/273; 307/293; 307/354
[58] Field of Search ............... 328/273, 265, 293, 354

[56] References Cited

U.S. PATENT DOCUMENTS

| | | | |
|---|---|---|---|
| 2,949,547 | 8/1960 | Zimmerman | 307/273 |
| 3,048,708 | 8/1962 | Raver | 307/273 |
| 3,202,834 | 8/1965 | Pingry et al. | 307/273 X |
| 3,480,801 | 11/1969 | Smith | 307/293 |
| 3,543,054 | 11/1970 | Schrader | 307/265 |
| 3,820,029 | 6/1974 | McKinley | 307/273 X |
| 3,883,756 | 5/1975 | Dragon | 307/265 |

Primary Examiner—John S. Heyman
Attorney, Agent, or Firm—Michael D. Bingham

[57] ABSTRACT

One shot and doubling one shot circuits are disclosed which produce fixed width output pulses in response to alternating input signals being applied thereto. Integrated injection logic ($I^2L$) and linear integrated circuit techniques are combined in the fabrication of the two circuits. Both the one shot and doubling one shot circuit comprises a switching transistor which is rendered conductive and nonconductive to produce the output pulse at its collector electrode. In response to the positive going transition of the input signal triggering signals are generated to render the switching transistor conductive. Conjointly, a capacitor is caused to charge toward a fixed potential until the magnitude of the voltage thereacross reaches a predetermined value which trips an output of a comparator circuit. The tripping of the comparator causes the switching transistor to be rendered nonconductive until the next positive going transition of the input signal. Modification of the one shot circuit to produce triggering signals on both the negative and going transitions of the input signals provides the doubling one shot function wherein fixed width output pulses are produced at the collector electrode of the switching transistor at each transition of the input signal.

22 Claims, 5 Drawing Figures

PULSE GENERATOR FOR PRODUCING FIXED WIDTH PULSES

CROSS REFERENCE TO RELATED APPLICATIONS

The subject matter of the subject invention is related to the subject matter of the application entitled "Switching Circuit Having Hysteresis", Ser. No. 967,825 and "Comparison Circuit Having Bidirectional Hysteresis", Ser. No. 967,826, by Marc T. Stein which are filed concurrently herewith and assigned to Motorola, Inc.

BACKGROUND OF THE INVENTION

This invention relates to pulse generator circuits and more particularly to multivibrator circuits for producing constant width output pulses in response to applied alternating input signals.

In a control system it is quite often desired to generate a constant width pulse in response to an applied alternating input signal. For instance, it might be desired to provide a precision one shot function where, in response to either the positive or negative going transition of the applied input alternating signal, a constant width output pulse is generated. The output pulse can then be integrated to provide an analog voltage. This analog voltage may be used to control or adjust some parameters of the system in which the multivibrator circuit is utilized. Moreover, it might be desired to generate a doubling one shot function wherein fixed output pulses are generated at both the negative and the positive going transitions of the applied alternating input signal.

It is important in such pulse generating systems that the output pulses be generated for the particular transition of the applied alternating input signal. A problem can occur when the frequency of the input alternating input signal is increased such that the period becomes quite small. In this mode it is quite possible that in prior art circuits the generation of the pulses will occur very rapidly, becoming crowded, such that the pulses tend to crowd together to become one and are no longer distinct from one another. If this were to happen, and if the pulses were integrated in the system, then an analog voltage having an incorrect magnitude could be generated. Thus it is important that crowding of the pulses be prevented during high frequency modes of operation of the control circuit.

SUMMARY OF THE INVENTION

Accordingly, an object of the present invention is to provide an improved pulse generator.

Another object of the present invention is to provide an improved pulse generator for producing a precision one shot function.

Still another object of the present invention is to provide a pulse generator system for producing a doubling one shot function.

A further object of the present invention is to provide a pulse generator system which prohibits pulse crowding when the system is in a high frequency mode.

A still further object of the present invention is to provide an improved pulse generator system for producing a precision one shot or doubling one shot function which is suitable to be manufactured in monolithic integrated circuit form.

In accordance with the foregoing and other objects there is provided a pulse generator circuit for producing output pulses of fixed width in response to applied alternating input signals. In one embodiment of the present invention the output pulses are generated with respect to the positive going transition of the applied input signal. In this embodiment, the pulse generator circuit comprises a triggering circuit adapted to receive the alternating input signal to generate triggering signals on the positive going transition of the alternating input signal, and a control circuit which is responsive to the applied triggering signals and to logic control signals supplied thereto for producing control signals at an output thereof. Additionally, the pulse generator circuit includes an output switching device which is responsive to the control signals from the control circuit for producing the output pulses and logic circuitry which produces the logic control signals. A high frequency control circuit is also provided which is enabled when the frequency of the applied input alternating signal becomes greater than a predetermined value in order to ensure that output pulses are generated at each positive going transition of the applied alternating input signal.

In another embodiment of the invention there is included a pulse generator system for producing output pulses having fixed widths upon both the negative going and the positive going transition of the applied alternating input signal. In this embodiment, the above described pulse generator circuit is modified such that the triggering circuit provides triggering signals on both the negative going and positive going transition of the applied alternating input signal. In this manner, the control circuit produces said control signals upon both negative and positive going transitions of the applied input signal which are then utilized to drive the output switching circuit to generate the output pulses at the appropriate times.

DETAILED DESCRIPTION OF THE PREFERRED EMBODIMENTS

Figure 1:
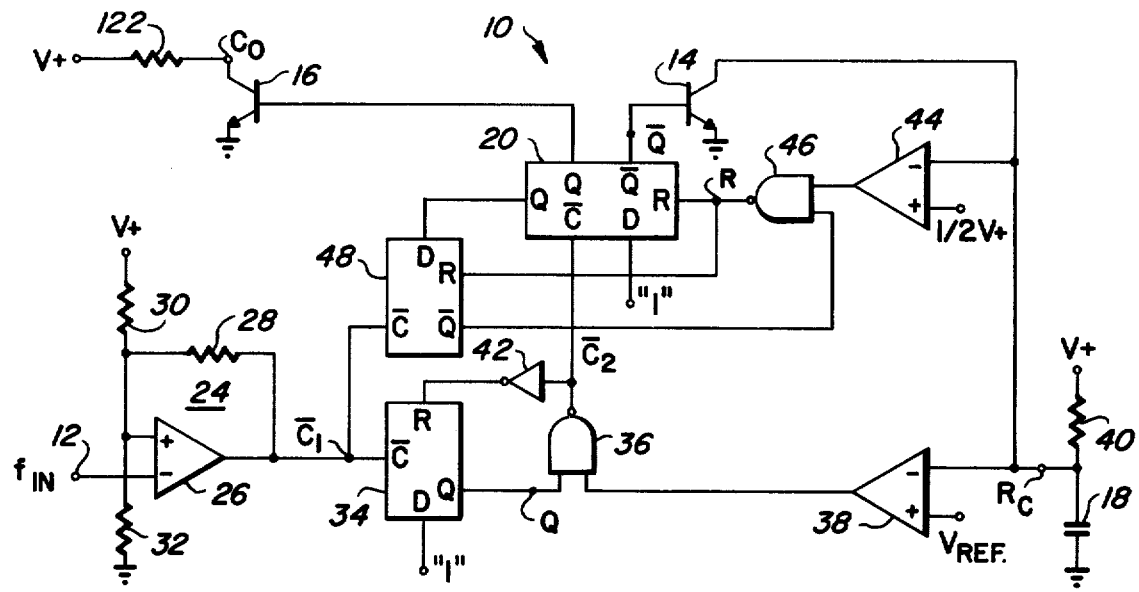
FIG. 1 illustrates in partial schematic and block diagram form the multivibrator or one shot pulse generator of the first embodiment of the invention.
Figure 3:
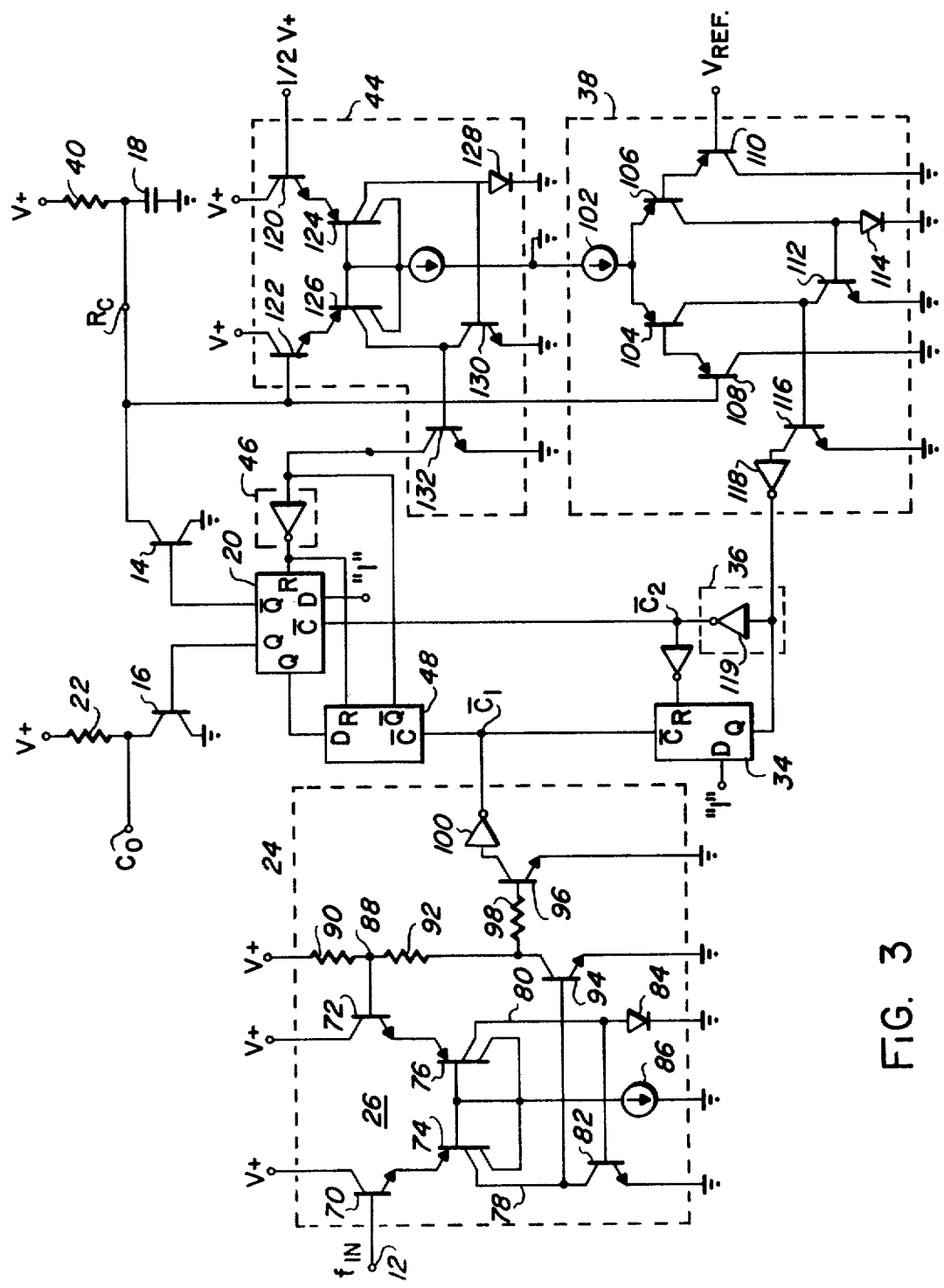
FIG. 3 is a detailed schematic diagram of the preferred embodiment of FIG. 1.

Turning to FIGS. 1 and 3, there is shown multivibrator or one shot pulse generator 10 of one embodiment of the present invention. One shot 10 is triggered by the positive going edge of triggering input signal $F_{IN}$ which is applied to input 12. As will be discussed in more detail, the application of $f_{IN}$ causes a constant width output pulse to be produced at output terminal $C_0$. It is understood that in agreement with the objectives of the present invention that the output pulse $C_0$ can be integrated and utilized to provide an analog voltage having a magnitude that is proportional to the frequency of $f_{IN}$.

Figure 2:
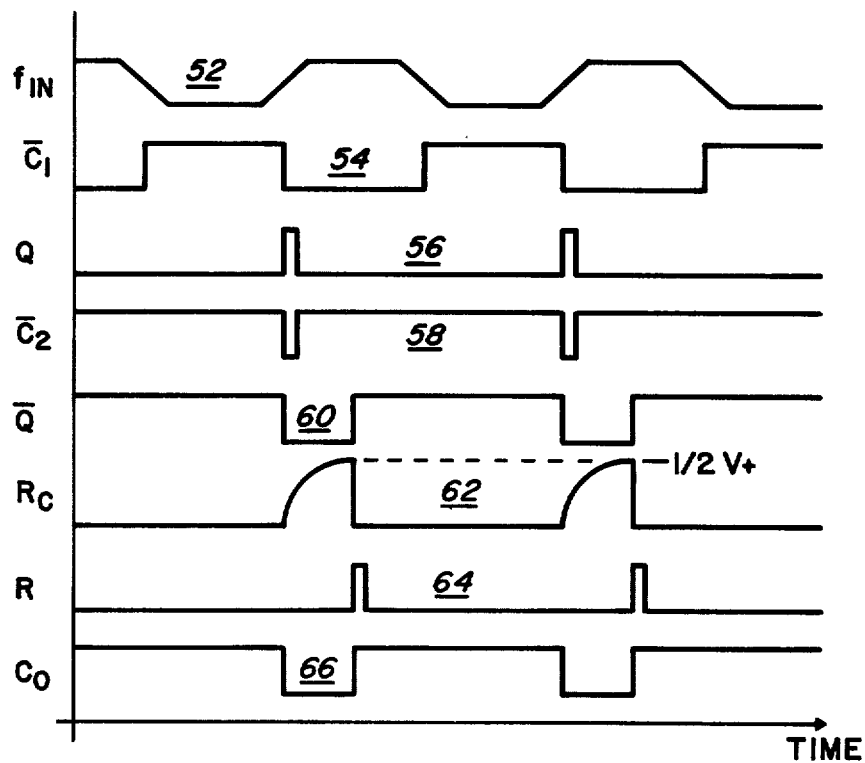
FIG. 2 is a waveform diagram useful for understanding the function of the embodiment of FIG. 1.

In conjunction with the waveforms illustrated in FIG. 2, the operation of one shot 10 can be described with the aid of FIG. 1. With one shot 10 in its monostable state, transistor 14 is conducting and transistor 16 is nonconducting. Hence, capacitor 18 is fully discharged by transistor 14 as is shown by waveform 62. Transistors 14 and 16 are maintained in their aforementioned states by the $\overline{Q}$ output (waveform 60) and its complementary output Q from D-type flip-flop 20 being applied to the respective base electrodes thereof. Thus, the output $C_0$ (waveform 66) of the one shot is nearly equal to the supply voltage V+ which is supplied via resistor 22 to the collector of transistor 16.

Triggering occurs on the positive going edge of input signal $f_{IN}$ (waveform 52) when the magnitude thereof becomes greater than the voltage supplied at the positive terminal of comparator 24. Comparator 24, comprising operational amplifier 26, feedback resistor 28 and resistors 30 and 32 functions as a comparator having hysteresis as described in the aforementioned Stein application, which is incorporated herein by reference, entitled "Comparison Circuit Having Bidirectional Hysteresis". When comparator 24 is triggered, its output goes negative (waveform 54). This negative transition of $\overline{C_1}$ cause the Q output of D-type flip-flop 34 to go high (waveform 56). The Q output of flip-flop 34 is applied to an input of NAND gate 36. Assuming the other input to NAND gate 36 is also high, the output of comparator 38 being high when capacitor 18 is discharged, the output $\overline{C_2}$ of the gate is forced low (waveform 58). This negative transition of $\overline{C_2}$ is applied to the C input terminal of flip-flop 20 causing the Q and $\overline{Q}$ outputs thereof to change states. This change of state causes transistor 14 to become nonconducting and transistor 16 conductive. The output $C_0$ will then be forced low and capacitor 18 starts charging through resistor 40; ramping toward the power supply voltage V+. The forcing of $\overline{C_2}$ low (output of gate 36) also resets flip-flop 34 through inverter 42.

When the magnitude of the voltage developed across capacitor 18 reaches the value $\frac{1}{2}$ V+, comparator 44 is triggered and its output goes low. In this condition, the output R (waveform 64) of NAND gate 46 is forced high which in turn resets flip-flop 20. Resetting of flip-flop 20 renders transistor 14 conductive again to discharge capacitor 18 and the aforedescribed cycle is initiated once again. Hence, in response to the triggering signal $f_{IN}$ an output pulse $C_0$ is produced having a fixed width which is determined by the RC time constant of capacitor 18 and resistor 40. If one shot 10 is a monolithic integrated circuit with resistor 40 and capacitor 18 provided off "chip" the width of pulse $C_0$ can be made substantially independent to temperature variations.

D-type flip-flop 48 is utilized only in a high frequency mode, i.e., when the frequency of $f_{IN}$ increases to a point where capacitor 18 cannot be charged completely to $\frac{1}{2}$ V+ between positive going edges of $f_{IN}$. Because output pulses $C_0$ may be integrated to provide an analog voltage proportional to the frequency of $f_{IN}$ it is important that each positive going edge of $f_{IN}$ is recognized or errors could be created in the integration scheme. Flip-flop 48 resets flip-flop 20 to discharge capacitor 18 if a new trigger edge of $f_{IN}$ is received from comparator 24 while capacitor 18 is still being charged: ramping toward V+. The operation of flip-flop 48 during the high frequency mode is explained hereinafter.

If $f_{IN}$ goes positive while capacitor 18 is ramping, the negative transition of $\overline{C_1}$ causes the $\overline{Q}$ output of flip-flop 48 to go low because the D input thereof is forced high by the Q output of flip-flop 20 being high during this period. This causes NAND gate 46 to change output states thereby applying a high output signal to the reset terminal of flip-flops 20 and 48. The resetting of flip-flop 20 causes the $\overline{Q}$ output therefrom to go high turning transistor 14 on to discharge capacitor 18. Resetting of flip-flop 20 also places flip-flop 48 into its nominal state ($\overline{Q}$ output high). A race condition between resetting of flip-flops 20 and 48 is prevented by the nominal gate delay through NAND gate 46. Thus, even in a high frequency mode, each positive edge of $f_{IN}$ is recognized.

The same negative edge of $\overline{C_1}$ which triggered flip-flop 48 also triggers flip-flop 34 such that the Q output therefrom goes high as previously described. However, as capacitor 18 is ramping at this time the output from comparator 38 is caused to be low so that there is no change in output state of NAND gate 36. However, the causing of capacitor 18 to be discharged through the triggering of flip-flop 48 causes the output of comparator 38 to go high which in conjunction with the Q output of flip-flop 34 being high then causes NAND gate 36 to change state. When the output of $\overline{C_2}$ goes low, capacitor 18 begins charging again as discussed above.

Turning now to FIG. 3, a more detailed schematic of one shot 10 is shown. It is to be understood that one shot 10 can be fabricated using monolithic integrated circuit techniques. Furthermore, the logic functions of one shot 10 are fabricated using known integrated injection logic ($I^2L$) techniques and the linear circuits are fabricated using linear integrated circuit techniques. It is to be understood that the $I^2L$ circuits utilize open collector transistors with a constant current source at each input thereof.

Comparator 24, which is described in the aforementioned Stein application entitled "Comparison Circuit Having Bidirectional Hysteresis" is briefly described. NPN transistors 70 and 72 are matched to one another during fabrication of one shot 10 as well as are PNP multi-collectors 74 and 76. Collector electrodes 78 and 80 are coupled to a current mirroring circuit comprising transistors 82 and diode 84, which is well known in the art, to provide a single ended output from amplifier 26 that is taken at the collector electrode of transistor 82.

As is understood, the trip point of amplifier 26 will occur when the magnitude of $f_{IN}$ exceeds $V_{88}$, the voltage at node 88. Switching current is provided by current source 86. If the magnitude of $f_{IN}$ is less than the voltage $V_{88}$, transistor 70 is either nonconductive. In this state, transistor 94 is nonconductive whereas transistor 96 is conductive. The magnitude of $V_{88}$ is determined by the resistor divider comprising resistors 90, 92, and 98 which are connected between V+ and the collector-to-emitter voltage of transistor 96. Transistor 96, being in a saturated condition, causes the output from inverter 100, waveform $\overline{C_1}$, to be in a high state as shown in FIG. 2. Now, when $f_{IN}$ becomes greater than the magnitude of $V_{88}$, amplifier 26 is tripped which causes $\overline{C_1}$ to go negative. In this state, transistor 70 is conductive and transistor 72 is nonconductive. Excess current from transistor 74 provides drive to the base of transistor 94 rendering it conductive. With transistor 94 conducting, transistor 96 is rendered nonconductive forcing the output $\overline{C_1}$ low. Moreover with transistor 94 conducting, the magnitude of $V_{88}$ is caused to be decreased which introduces hysteresis into the circuit. Therefore, as described, comparator 24 is triggered on the positive edge of $f_{IN}$ to trigger flip-flop 34 and 48.

Amplifier 38 is shown as including current source 102 which provides current to differentially connected PNP transistors 104 and 106. These transistors are coupled in a quasi-Darlington amplifier configuration to transistors 108 and 110 respectively. The collector electrodes of transistors 104 and 106 are coupled to a single ended output circuit comprising transistor 112 and diode 114 as well as transistor 116 in a similar manner as discussed with regards to amplifier 26. The output of amplifier 38 which is coupled to NAND gate 36 (shown as inverter 119) is provided at the output of inverter 118.

In operation, with capacitor 18 discharged, transistors 104 and 108 conduct more heavily than transistors 106 and 110 because the latter transistors are biased by $V_{REF}$ which is supplied to the base of transistor 110 is of greater magnitude than the bias potential supplied at the base of transistor 108. In this state, excess current is provided at the collector of transistor 104 to render transistor 116 conductive. Hence, the potential appearing at the collector electrode of transistor 116 will be near ground potential. Inverter 118 which is coupled to the collector of transistor 116 is then caused to produce a logic "1" at the output of comparator 38 which is in agreement with the aforedescribed operation. The output of amplifier 38 remains high until such time as the potential supplied at the base of transistor 108 becomes greater than the magnitude of $V_{REF}$. When this condition occurs transistor 106 conducts more heavily than transistor 104. Transistor 112 then becomes saturated such that the base drive current is "starved" from transistor 116 rendering it nonconductive and thereby causing the output, via inverter 118, of comparator 38 to go to a logic "0". Therefore as described immediately above, the output from comparator 38 is maintained and a logic "1" when capacitor 18 is discharged through transistor 14 whereby NAND gate 36 is triggered by the change of logic states at the output of flip-flop 34 caused by the triggering signal $f_{IN}$.

Comparator 44 operates in substantially the same manner as comparator 38 to drive one input of NAND gate 46 which is shown as a two input inverter gate. For example, with capacitor 18 discharged, NPN transistor 120 is more conductive than NPN transistor 122. Multi-collector PNP transistor 124 is therefore more conductive than multi-collector PNP transistor 126. Because current source 127 sinks a constant current from transistors 124 and 126, the excess current from transistor 124 to diode 128 causes transistor 130 to be in a saturated state. This in turn prevents base current drive from being sourced to transistor 132 which renders it nonconductive. Transistor 132 being nonconductive establishes a logic "1" to the input of NAND gate 46. Subsequent to triggering of one shot 10, when the magnitude of the potential appearing across capacitor 18 becomes equal to $\frac{1}{2}$ V+, the output of comparator 44 switches causing resetting of flip-flop 20. Switching of the comparator occurs because transistors 122 becomes more conductive than transistor 120. In this condition, transistor 126 conducts more heavily than transistor 124 and transistor 130 is no longer saturated. Thus, the excess current is supplied to the base of transistor 132 rendering it conductive to force its collector to go low generating a logic "0".

Figure 4:
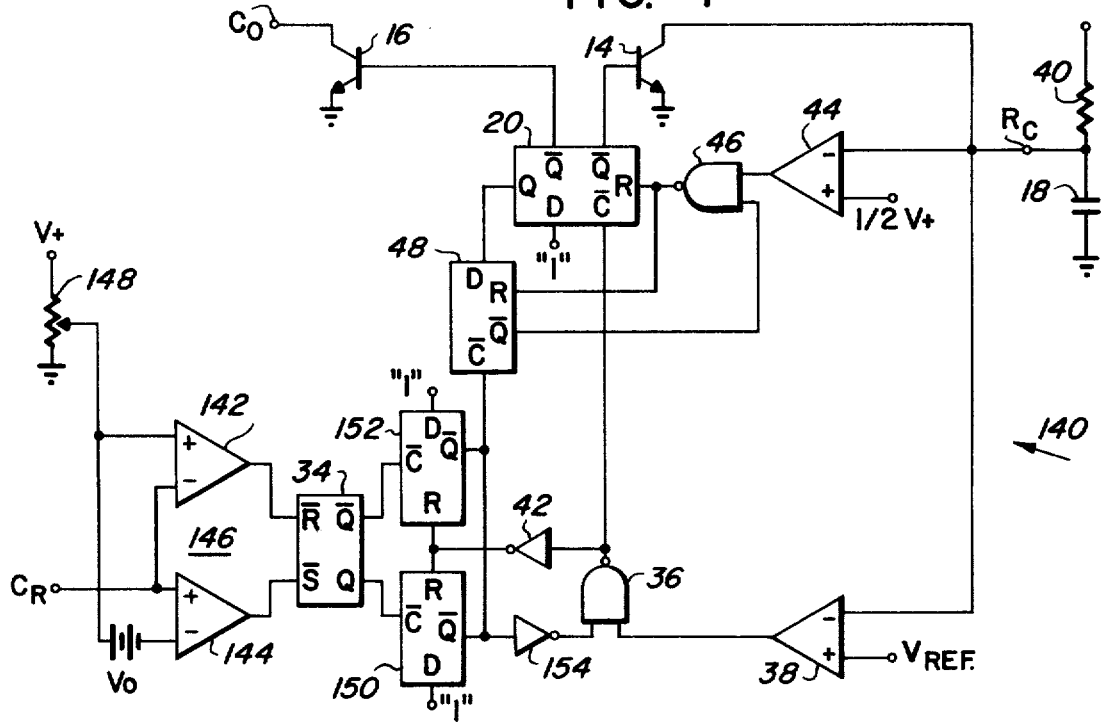
FIG. 4 is a partial schematic and block diagram form of a doubling one shot pulse generator of a second embodiment of the invention.
Figure 5:
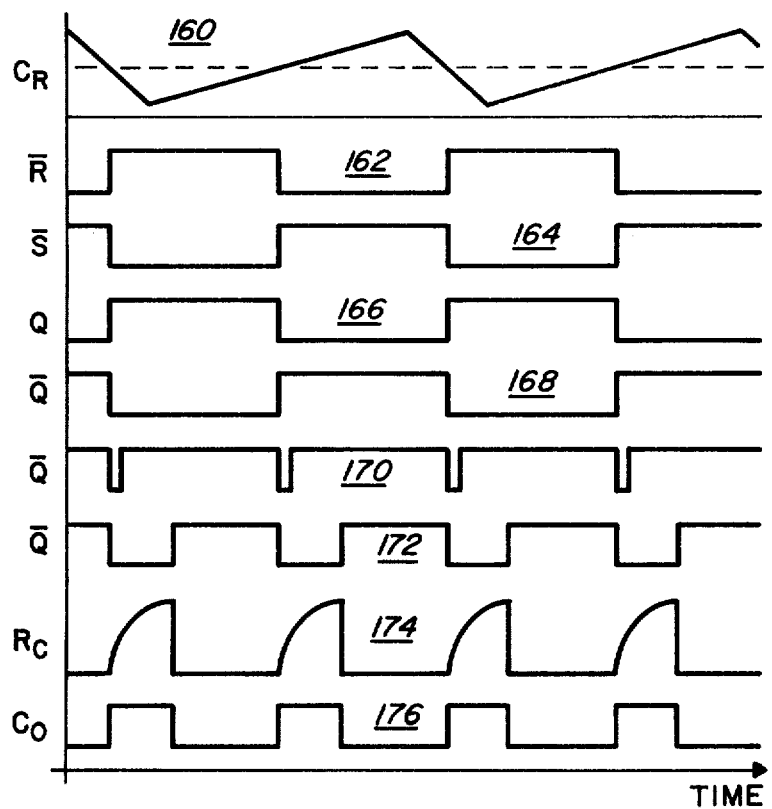
FIG. 5 is a waveform diagram useful for understanding the function of the embodiment of FIG. 4.

Turning now to FIGS. 4 and 5 there is shown pulse generator 140 which functions in substantially the same manner as one shot 10 but produces two fixed width output pulses for each complete cycle of the input signal $C_r$. In FIG. 4 the components which correspond to like components of FIG. 1 are numbered with the same reference numerals. Briefly, pulse generator 140 responds to the positive and negative going edges or transitions of $C_r$ to produce output pulses at output terminal $C_0$ of the generator.

In operation, assuming transistor 14 is conducting (the $\overline{Q}$ output of flip-flop 20 being high or at a logic "1") capacitor 18 will be discharged as illustrated by waveform 174. This condition produces a logic "1" at the output of comparator 38 which is applied to one input of NAND gate 36. The output at terminal $C_0$ will also be in a low state (waveform 176) as transistors 16 is also conducting. Operational amplifiers 142 and 144 comprise comparator 146. The construction of comparator 146 is the same as the circuit disclosed in the application entitled "Switching Circuit Having Hysteresis" referenced above and is incorporated by reference herein. Functionally, the outputs of amplifiers 142 and 144 (waveforms 162 and 164 respectively) are the complementary of each other and trip at a value of the input signal $C_r$ that is the magnitude $V_0$ apart from each other to set and reset flip-flop 34.

As illustrated, a constant reference voltage developed across potentiometer 148 is applied to both the noninverting input of amplifier 142 and the inverting input of amplifier 144. Hence, with the magnitude of $C_r$ greater than the magnitude of $V_{148}$, the output $\overline{R}$ from amplifier 142 is low and output $\overline{S}$ from amplifier 144 is high. On the negative transition of $C_r$, amplifier 142 is caused to be tripped when the magnitude of $C_r$ is substantially equal to the magnitude of $V_{148}$ and the output therefrom then goes to a high state. Amplifier 144 is tripped by a further decrease in the magnitude of $C_r$, which in the preferred embodiments is 36 millivolts, to cause the output $\overline{S}$ to go to a low state. With $\overline{S}$ low, the Q and $\overline{Q}$ outputs of flip-flop 34 (waveforms 166 and 168) are clocked high and low respectively.

D flip-flops 150 and 152 which act in conjunction to function as a frequency doubler, receive the Q and $\overline{Q}$ outputs respectively from flip-flop 34. The negative transition of $\overline{Q}$ output applied to flip-flop 152 causes the $\overline{Q}$ output therefrom to go negative. Similarly, when $C_r$ goes positive and its magnitude becomes greater than $V_{148}$ the outputs from amplifiers 142 and 144 change states which cause the output $\overline{Q}$ of flip-flop 150 to be triggered and to go negative. Hence, in response to each transition of input signal $C_r$, the $\overline{Q}$ outputs of flip-flops 150 and 152 are alternatively clocked to a low state. When the $\overline{Q}$ output of flip-flop 152 is clocked low a high or logic "1" is applied to one input of NAND gate 36 via inverter 154. Since both inputs are high NAND gate 136 is then caused to change states. The negative transition of the output of NAND gate 36 both resets flip-flop 152 via inverter 42 and clocks the $\overline{Q}$ outputs of flip-flop 20 to a low state (waveform 172). Resetting of flip-flop 152 also resets the output of NAND gate 36 to a high state. This action renders The $\overline{Q}$ outputs of flip-flop 20 being clocked low cause transistors 14 and 16 to be rendered nonconductive. Hence, the output at terminal $C_0$ is forced to a high state, waveform 176.

Transistors 14 and 16 will remain off until capacitor 18, charging through resistor 40, is ramped to a value equal to $\frac{1}{2}$ V+ which trips comparator 44 causing its output to go low. The low state at the output of comparator 44 forces the output of NAND gate 46 to go high which resets flip-flop 20 causing the $\overline{Q}$ outputs therefrom to again go to a high state. This renders transistors 14 and 16 conductive to discharge capacitor 18 (waveform 174) and to cause the output at terminal $C_0$ to go low (waveform 176) respectively.

Similarly, when flip-flop 150 is triggered by the positive going transition or $C_r$, the above cycle is repeated. Thus, a fixed width output pulse is generated at the output of transistor 16 upon each negative and positive transition of input alternating signals $C_r$. Again, these pulses may be used in a control system to provide an analog control voltage.

As described for one shot 10 of FIG. 1, flip-flop 48 is utilized to ensure that each transition of input signal $C_r$ is recognized even when the circuit is in a high frequency mode of operation wherein the RC time constant of resistor 40 and capacitor 18 prevents capacitor 18 from becoming fully charged to the value $\frac{1}{2}$ V+ during a full cycle of operation.

What is claimed is:

1. Apparatus responsive to an applied alternating input signal, for generating pulses having a fixed pulse width in response comprising:
   output circuit means responsive to applied control signals for producing the output pulses at an output terminal thereof;
   control circuit means responsive to applied triggering signals and logic control signals for producing said control signals, said control circuit means includes a D-type flip-flop having first and second complementary outputs, clock input and reset input terminals, said clock input terminal receiving said triggering signals, said reset terminal receiving said logic control signals and said control signals appearing at said complementary output terminals thereof with said first complementary output being coupled to said output circuit means and said second complementary output being coupled to said circuit means for producing logic control signals;
   circuit means for producing said logic control signals, said circuit means for producing logic control signals includes:
   a. switching means coupled to said second complementary output of said control circuit means and being rendered selectively conductive and nonconductive by said control signals appearing at said second complementary output;
   b. charge circuit means coupled to said switching means, said charge means being responsive to said switching means being rendered nonconductive for producing a ramping output signal, said charge circuit means being discharged when said switching means is rendered conductive such that said output signal is held constant at a first predetermined value;
   c. circuit means coupled to said charge circuit means and said switching means which is responsive to the magnitude of said ramping output signal becoming greater than a second predetermined value for producing at an output thereof said logic control signals; and
   triggering circuit means responsive to the alternating input signal for producing said triggering signals at predetermined portions of the input alternating signal, said triggering circuit means includes:
   a. first comparator means receiving the alternating input signal for producing a clocking signal having positive and negative going edges respectively at an output thereof;
   b. first logic control circuit responsive to said clocking signal being applied thereto for producing first gate triggering signals at an output thereof on a predetermined one of said edges of said clocking signal;
   c. second comparator means coupled to said charge circuit means for producing second gate triggering signals the state thereof being determined by the magnitude of said ramping output signal from said charge circuit means; and
   d. first logic gating means responsive to said first and second gate triggering signals being applied thereto for producing said triggering signals at an output thereof, said output being coupled to said control circuit means and to said first logic control circuit for resetting said first logic control circuit.

2. The apparatus of claim 1 wherein: said first logic control circuit being a D-type flip-flop having a clock, reset and output terminals, said clock terminal being coupled to said output of said first comparator means, said output terminal being coupled to an input of said first logic gating means, and said reset terminal being coupled to an output of said first logic gating means; and
   said first logic gating means including a first logic gate which receives said first and second gate triggering signals and an output, said output being coupled to said clock input of said D-type flip-flop of said control circuit means, and inverter means coupled between said output of said first logic gating means and said reset terminal of said D-type flip-flop of said first logic control circuit.

3. The apparatus of claim 1 wherein said circuit means for producing logic control signals further includes:
   said switching means being an NPN transistor having base, emitter and collector electrodes, said base electrode being coupled to said second complementary output of said control circuit means, said emitter electrode being coupled to a ground reference terminal; and
   said charge circuit means including a charge storage device having first and second electrodes, said first electrode being coupled to said collector of said NPN transistor comprising said switching means, said second electrode being coupled to said ground reference terminal, and resistive circuit means coupled between said first electrode of said charge storage device and a terminal at which is supplied an operating potential.

4. The apparatus of claim 3 wherein said circuit means for producing said logic control signals includes first comparator means having an input coupled to said first electrode of said charge storage device and an output, and first logic gating means having an input coupled to said output of said comparator means and an output coupled to the reset terminal of said D-type flip-flop of said control circuit means.

5. The apparatus of claim 4 wherein said triggering circuit means includes:
   second comparator means receiving the alternating input signal for producing a clocking signal having positive and negative going edges respectively at an output thereof;
   first logic control circuit responsive to said clocking signal being applied thereto for producing first gate triggering signals at an output thereof on a predetermined one of said edges of said clocking signal;
   third comparator means coupled to said charge circuit means for producing second gate triggering signals the state thereof being determined by the magnitude of said ramping output signal from said charge circuit means; and second logic gating means responsive to said first and second gate triggering signals being applied thereto for producing said triggering signals at an output thereof, said output being coupled to said control circuit means and to said first logic control circuit for resetting said first logic control circuit.

6. The apparatus of claim 5 wherein:

said first logic control circuit being a D-type flip-flop having a clock, reset and output terminals, said clock terminal being coupled to said output of said second comparator means, said output terminal being coupled to an input of said second logic gting means, and said reset terminal being coupled to an output of said second logic gating means; and said second logic gating means including a first logic gate which receives said first and second gate triggering signals and an output, said output being coupled to said clock input of said D-type flip-flop of said control circuit means, and inverter means coupled between sid output of said second logic gating means and said reset terminal of said D-type flip-flop of said first logic control circuit.

7. The apparatus of claim 6 including an additional D-type flip-flop having first, second and third inputs and an output, said first input being coupled to said output of said second comparator, said second input being coupled to said first complementary output of said D-type flip-flop of said control circuit means, said third input being coupled to said output of said first logic gating means, said output being coupled to said input of said first logic gating means.

8. The apparatus of claim 4 wherein said triggering circuit means includes:

second comparator means receiving the alternating input signal for producing first and second complementary output signals at respective outputs corresponding to the negative and positive going transitions of the alternating input signal;

first logic controlled circuit receiving said first and second complementary output signals from said second comparator means for producing first alternate gate triggering signals;

third comparator means coupled to said charge circuit means for producing said second gate triggering signals at the output thereof; and second logic gating means receiving said first and second gate triggering signals for generating said triggering signals.

9. The apparatus of claim 8 wherein said first logic controlled circuit includes:

a RS flip-flop having set and reset terminals and first and second complementary output terminals, said set terminal being coupled to one of said complementary outputs of said second comparator, said reset terminal being coupled to the other one of said complementary outputs of said second comparator;

first additional D-type flip-flop having a clock input terminal, a reset terminal and an output terminal, said clock input terminal being coupled to said first complementary output of said RS flip-flop, said reset terminal being coupled to the output of said second logic gating means, said output being coupled to the input of said logic gating means; and second additional D-type flip-flop having a clock input terminal, a reset terminal and an output terminal, said clock input terminal being coupled to said second complementary output terminal of said RS flip-flop, said reset terminal being coupled to said output of said second logic gating means, said output being coupled to said input of said second logic gating means.

10. The apparatus of claim 9 wherein said second comparator comprises a first operational amplifier having inverting and noninverting inputs and an output, said inverting input being coupled to an input of the apparatus for receiving thereat the alternating input signal, the noninverting input receiving a reference potential supplied thereto, said output being said other complementary output of said second comparator means, and a second operational amplifier having inverting and noninverting inputs and an output, said inverting input receiving said reference potential, said noninverting input receiving said alternating input signal, and said output being said one complementary output of said second comparator means.

11. The apparatus of claim 10 including third additional D-type flip-flop having first, second, third input terminals and an output terminal, said first input terminal being coupled to said output terminals of said first and second additional D-type flip-flops, said second input terminal being coupled to said first complementary output of said D-type flip-flop of said control circuit means, said third input terminal being coupled to said output of said first logic gating means, and said output terminal being coupled to said input of said first logic gating means.

12. A multivibrator adapted to receive an alternating input signal having a frequency that varies between a minimum and maximum value during normal operation for producing a fixed width output pulse during each cycle of the input signal, comprising:

output circuit means having an output coupled to an output of the multivibrator for producing an output signal having a first level state during normal operation, said output circuit means being responsive to a first applied signal such that said output is caused to change to a second level state, said output circuit means being responsive to a reset signal such that said output signal is reset to said first level state:

first gating means responsive to a triggering signal for producing said first applied signal at an output thereof;

trigger circuit means responsive to the alternating input signal passing through a zero reference level in a predetermined sense for producing said triggering signal during each cycle of the input signal; and circuit means having an input and output and responsive to said output signal from said output circuit means switching to said second level state for producing said reset signal at said output a fixed, predetermined time interval thereafter during normal operation whereby the fixed width pulse is produced, said output of said circuit means being directly coupled to an input of said output circuit means.

13. The multivibrator of claim 12 including a logic circuit which is rendered operative during a high frequency mode of operation of the multivibrator when the frequency of the alternating input signal becomes greater than the maximum value obtained in normal operation, said logic circuit being responsive to the applied alternating input signal passing through said zero reference level when said output signal from said output circuit means is in said second level state for causing resetting of said output circuit means such that the multivibrator recognizes that the alternating input signal has passed through said zero reference level during operation in said high frequency mode.

14. The multivibrator of claim 12 or 13 wherein said output circuit means includes a first flip-flop circuit having an input, first and second complementary outputs and a reset input, said input being coupled to the output of said first gating means, said first output being coupled to the output of the multivibrator, said second output being coupled to said input of said circuit for producing said reset signal.

15. The multivibrator of claim 14 wherein said trigger circuit means includes:
   first comparator means which receives said alternating input signal for producing substantially a fifty percent alternating duty cycle output signal at an output thereof, said output being coupled to an input of said logic circuit; and
   a second flip-flop having an input to receive said output signal from said first comparator means for producing said triggering signal at an output thereof in response to said output signal from said first comparator means going negative, said second flip-flop having a reset input coupled to an output of said first gating means such that said second flip-flop is reset by said first applied signal.

16. The multivibrator of claim 15 wherein said first gating means includes a logic gate having a first input coupled to said output of said second flip-flop and said output coupled to said first input of said first flip-flop and to said input of said output circuit means.

17. The multivibrator of claim 16 wherein said circuit for producing said reset signal includes:
   charge storage means, said charge storage means being charged toward a first predetermined potential when said output signal from said output circuit means is in said second level state;
   switching means coupled between said second output of said first flip-flop and said charge storage means, said switching means being responsive to the signal applied thereto when said output signal appearing at said first output of said first flip-flop is in said first level state for discharging said charge storage means; and
   comparator circuit means responsive to said charge storage means being charged to a predetermined reference potential level for producing said reset signal at said output of said circuit for producing said reset signal.

18. The multivibrator of claim 17 wherein:
   said comparator circuit means includes a second comparator means for producing a first logic signal at an output thereof when said charge storage means reaches said reference potential level, second gating means having an input coupled to said output of said second comparator means which produces said reset signal in response to said first logic signal; and
   said circuit for producing said reset signal further includes a third comparator means responsive to said charge storage means being discharged for producing a first logic signal at an output thereof and being responsive to said charge storage means being charged toward said reference level for producing a second logic signal, said output of said third comparator means being coupled to a second input of said first gating means.

19. The multivibrator of claim 18 wherein said logic circuit includes a third flip-flop having an input, reset and output terminals, said input being coupled to said output of said first comparator means, said output being coupled to a second input of said second gating means, said reset terminal being coupled to said first output of said first flip-flop, said output being in a nominal output level state such that said second gating means is responsive to said first logic signal from said second comparator means.

20. The multivibrator of claim 19 wherein said flip-flop circuits are D-type flip-flops.

21. The multivibrator of claim 14 wherein said trigger circuit means includes:
   first comparator means having first and second inputs and an output, said first input being coupled to a terminal at which is supplied a first reference potential, said second input being adapted to receive said alternating input signal;
   second comparator means having first and second inputs and an output, said first input being adapted to receive said alternating input signal;
   voltage offset means coupled between said first terminal of said first comparator means and said second terminal of said second comparator means for maintaining a predetermined voltage offset therebetween;
   a second flip-flop having first, second inputs and first, second complementary outputs, said first input being coupled to said output of said first comparator means, said second input being coupled to said output of said second comparator means;
   a third flip-flop having an input, output and reset terminal, said input being coupled to said first output of said second flip-flop, said output being coupled to an input of said first gating means, said reset terminal being coupled to said output of said first gating means; and
   a fourth flip-flop having an input, an output, and reset terminal, said input being coupled to said second output of said second flip-flop, said output being coupled both to an input of said logic circuit and to said input of said first gating means, said reset terminal being coupled to said output of said first gating means.

22. The multivibrator of claim 21 wherein:
   said logic circuit being a D-type flip-flop;
   said second flip-flop being a RS-type flip-flop; and
   said first, third and fourth flip-flops being D-type flip flops.

* * * * *